PREPARATION OF ETCHED PLATES
Filed March 16, 1960
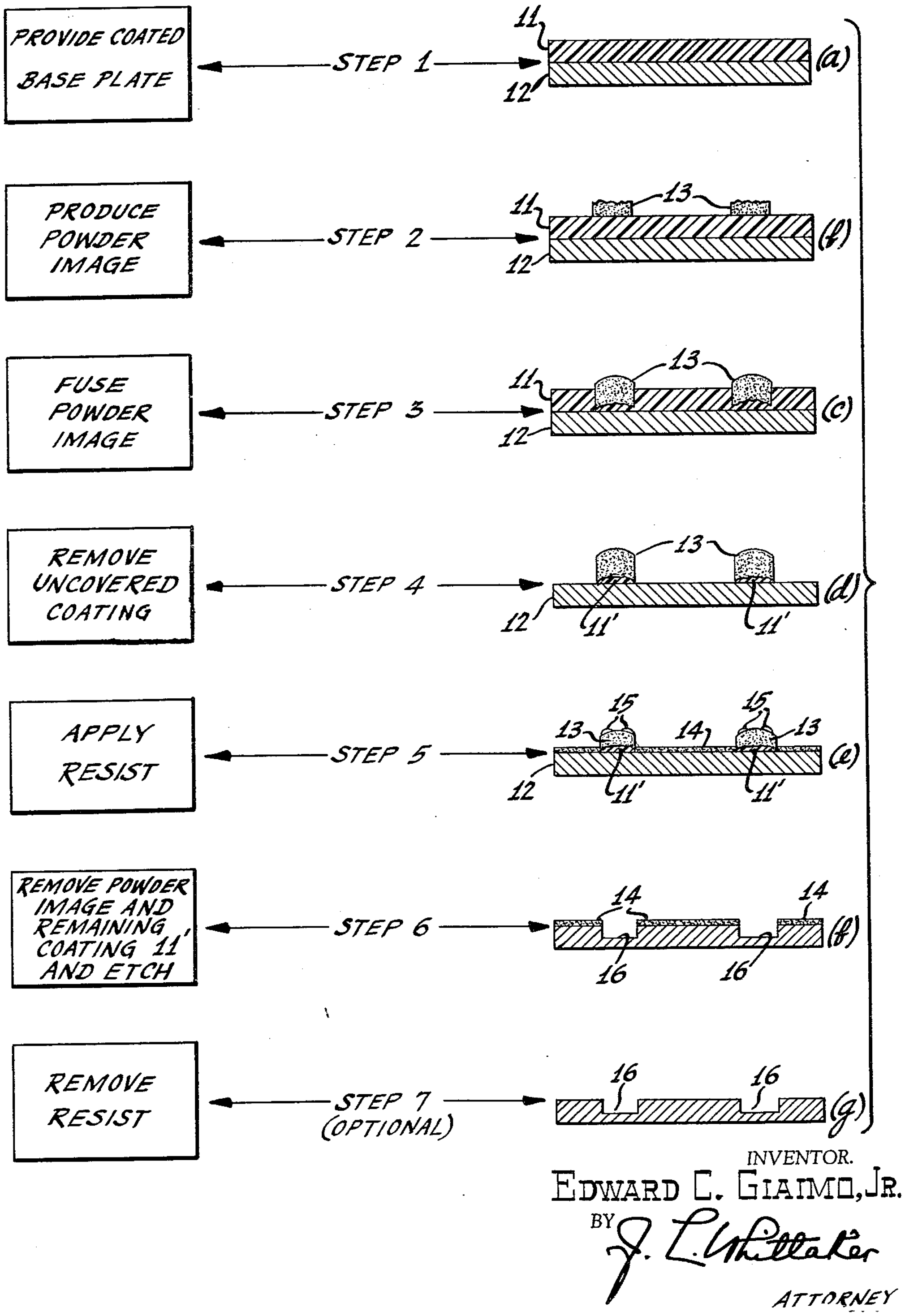
INVENTOR.
EDWARD C. GIAIMO, JR.
BY J. L. Whittaker
ATTORNEY United States Patent Office 3,121,009

Patented Feb. 11, 1964

3,121,009

PREPARATION OF ETCHED PLATES

Edward C. Giaimo, Jr., Princeton, N.J., assignor to Radio Corporation of America, a corporation of Delaware Filed Mar. 16, 1960, Ser. No. 15,368
8 Claims. (Cl. 96—1)

This invention relates to improved methods for producing etched plates and more particularly, but not exclusively, to the production of etched or engraved plates such as are employed in the graphic arts.

Photoresists, which comprise one class of photochemical compositions, are commonly used in the graphic arts for preparing typographic, lithographic and gravure printing plates. Photoresists are also commonly used in the electronic arts for preparing etched circuits and components. In conventional photoetching processes, the object to be etched or engraved, usually a metal plate or metal clad substrate, is coated with a soluble photoresist. The photoresist is then exposed to a light image, usually by contact exposure, until the exposed photoresist is insolubilized or "hardened" in the exposed areas. The unexposed photoresist is washed away and the object is etched to the desired depth.

Many photoresists require relatively long exposures to the light image because of the relatively insensitivity of the photoresists available. Consequently, it becomes a practical necessity to first prepare a permanent, relatively dense, full size transparency of the subject matter to be etched. The transparency must then be held firmly against the photoresist during the relatively long, intense exposure to light to obtain the necessary hardening of the photoresist with a minimum loss in resolution. To accomplish this, photoetchers resort to special vacuum frames for holding the transparency in place, and to intense light sources for exposure. Even so, exposure times of 10 minutes or more are common.

By a second photoetching process a base plate is coated with a soluble photoresist which is in turn overcoated with a photoconductive insulating coating. The photoconductive coating is electrostatically charged and then exposed to an ordinary visible light image, thereby producing a latent electrostatic image on the coating. The latent electrostatic image is developed with an opaque powder which is electrostatically held on the photoconductive coating. The photoresist is then exposed through the photoconductive coating, the powder image thereon acting as a mask to prevent hardening of underlying photoresist. While this latter method is generally suitable for most applications, it does have some disadvantages which make it unsuitable for other applications. For example, since most photoresists have a shelf life limited to a maximum of about five days, the plates are generally coated just prior to use. When the photoresist is overcoated with the it can be electrostatically charged. Thus the time required for preparing a printing plate is increased in an amount which can be objectionable in high speed operations.

Accordingly, it is a general object of this invention to provide improved methods of preparing etched plates.

It is a further object to provide improved methods of preparing etched plates of high resolution.

Another object is to provide improved methods of preparing etched plates wherein a minimum of time is spent in the preparation thereof.

A still further object of this invention is to provide improved methods of preparing etched printing plates wherein shelf life of photoresists need not be of concern.

Generally, the foregoing and other objects and advantages are accomplished by providing an etchable base plate which may have either a grained or a smooth surface on which there is a resinous insulating coating or a photoconductive insulating coating. A latent electrostatic image is produced on the coating and the image developed with a fusible hydrophobic powder. Next, the powder image is fused to, and preferably through, the coating, after which all areas of the coating not covered by the powder image are removed, leaving the fused image adhering to the base plate. The next step comprises applying a second coating to the base plate to provide a resist thereon in areas not covered by the fused image. To prepare the plate for etching, the fused image and remaining coating are removed to bare the underlying surface of the base plate, such bared surface areas then being etched.

The invention will be described in greater detail by reference to the single figure of the drawing which is a flow chart of the method steps of the invention and corresponding cross-sectional sketches which diagrammatically illustrate the transformation taking place during preparation of an etched plate.

Similar reference characters are applied to similar elements throughout the drawing.

As depicted in sketch (*a*) Step 1, a base plate 12 such as, for example, magnesium or zinc is provided having an insulating coating 11 by creating thereon an electrostatic image and developing that image with an electroscopic hydrophobic material.

METHOD I

One method of electrostatically producing a powder image is described in U.S. Patent 2,919,170 to H. Epstein. Briefly this method comprises passing a resin coated member over a grounded backing member while energizing a plurality of corona generating needles in accordance with a proper code. The corona needles cause charge dots to be deposited on the resin surface in the form of alpha-numeric characters. Electroscopic fusible powder is then applied to the charge dots to produce visible powder images.

METHOD II

A second, and preferred, method for producing powder images involves electrophotographic techniques. In such a method, a base plate 12, shown in sketch (*a*), is provided which is coated with a photoconductive insulating layer 11 such as, for example, a layer comprising photoconductive zinc oxide dispersed in a resinous polysiloxane binder. Such a layer or coating is described in U.S. Patent 2,857,271 to M. L. Sugarman, Jr. Also described in the latter patent are other suitable photoconductors and binders. Electrophotographic methods of producing powder images on a photoconductive layer generally comprise producing on the layer a substantially uniform over-all charge, as by exposure to a corona discharge unit; discharging selected areas on the layer by exposure to a light image; and, applying electroscopic fusible powder to the layer to produce an image 13, which may be visible in the areas thereon which still retain a charge. Such methods are also described in the above-mentioned Sugarman patent.

As depicted in sketch (*c*), Step 3 of the methods of this invention comprises fusing the powder image 13 to, and preferably through, the coating 11. This is done by heating the powder image 13 to a temperature above its melting point. Preferably, a sufficiently high temperature is employed to cause some softening of the coating 11 to enhance the penetration of the powder image 13 into the coating 11.

As shown in sketch (*d*), Step 4, the coating 11 is removed from all areas not covered by the fused powder image 13, leaving in such areas a bare surface of the base plate 12. A preferred method for removing the coating 11 comprises applying thereto a reagent which is a solvent for the coating 11 (or for the binder in the coating) but which is not a solvent for the fused powder image. The solvent is one which at least causes swelling and/or softening of the coating 11. For example, when the coating or binder comprises silicone resin, it can be readily removed with alcohol or alcohol mixtures. In such a case, the material of the powder image 11 is selected to be insoluble in the solvent for the coating 11. The selection of the compositions of the binder or coating 11, the developer powder 13, and the solvent are interdependent upon one another. This interdependence is more fully explained and further examples of suitable materials are provided in a subsequent portion of this description.

It has been found that for optimum results in further processing, the bared surface areas of the base plate 12 should be as clean as possible. This result is frequently obtained as a result of the application of the solvent in Step 4. However, more consistent results are obtained by incorporating additional cleaning techniques in that step. For example, improved cleaning is obtained if the solvent is applied with a cotton swab and the coated plate is vigorously rubbed with the solvent. Some technique such as rubbing is used when the coating 11 is only softened or swelled by the solvent. Further improvement can be obtained by subsequently washing the plate with a detergent. When a grained base plate is employed, still further improvement can be provided by washing the plate with a dilute etchant solution. When the base plate 12 has a smooth surface, a stronger etchant solution may be employed to roughen that surface and thereby improve the wetability thereof.

Following the procedure outlined in Step 4, the bared surface areas of the base plate 12 are coated with a resist material 14, Step 5, as depicted in sketch (*e*). When the base plate comprises magnesium, zinc, or copper, a resist of a noble metal such as silver can be conveniently applied. For example, silver can be electroplated on the bare surface areas of the plate 12 and will not adhere to the powder image. Alternatively a silver resist may be applied by dipping the plate 12 in a contact silver plating solution such as "Nusilver" a solution marketed by Nusilver Makers, Aurora, Illinois. The contemplated metallic resist can be applied in such thin layers (sub-micron thickness) that gold or platinum resists can also be economically employed.

Also contemplated in the procedure of Step 5 is the application of conventional photoresists to the bared areas on the base plate 12. One example of a suitable photoresist coating composition is as follows:

| | G. |
|---|---|
| Photoengraving glue | 360 |
| Ammonium bichromate | 52.5 |
| Dried albumin | 7.5 |
| Water to make 1 liter. | |

This formulation may be coated on the bared areas of the base plate 12 by any commonly used techniques, such as, for example, by pouring over the surface of the plate. The resist on the base plate is then dried as, for example, by means of compressed air. After drying, the photoresist is hardened either by exposure to light or by heating. Other suitable photoresists are described in H. Bennett, The Chemical Formulary, D. Van Nostrand Company, Inc., N.Y., vol. II, 1935, pages 402–404, and vol. VI, 1943, page 385 et seq.

When photoresists are employed in the procedure of Step 5, sketch (*e*), it sometimes happens that portions thereof will wet the powder image and adhere thereto, as depicted at 15. Such a result can be prevented by a simple preparation treatment prior to applying the photoresist to the base plate 12. This treatment involves applying to the plate a fountain or "wet-out" solution such as, for example, an aqueous solution of glycerin slightly acidified with phosphoric acid, acid phosphates, or similar substances. The fountain solution wets all of the bared portions of the base plate 12 but does not wet the hydrophobic powder image 13. After applying the fountain solution, the powder image 13 is covered with a water repellant grease. This may be accomplished for example, by inking with a grease-base lithographic printing ink. Inking is conveniently accomplished by passing a conventional inking roller across the surface of the image bearing base plate 12 to leave a thin ink film on the powder image 13. No ink is left in the bared surface areas of the base plate 12 which are covered by a film of ink-repellant fountain solution. Once the powder image 13 is inked, the photoresist may be applied without the resist material adhering to the powder image 13. If cleaning with an etchant as described in Step 4, sketch (*d*), was omitted from that step, it can conveniently be accomplished after the fused powder image has been inked.

Method Step 6 depicted in sketch (*f*) comprises removal of the fused powder image 13 along with any remaining coating material 11′ and etching of the base plate 12 in areas formerly masked by the fused powder image. If the etching solution is a solvent for the fused powder image 13 and for the remaining coating material 11′ only one manipulation, etching, is required. However, under many circumstances it will be found more convenient first to remove the fused powder image 13 and remaining coating 11′ with a reagent which is a common solvent for both of them but which is not an etching solution, after which the base plate 12 is etched with an acid or alkaline solution.

The methods of this invention also contemplate an additional optional Step 7 of removing the resist 14 from the etched base plate 12, as shown in sketch (*g*). When a metallic resist is employed this step usually is unnecessary. However, when a photoresist is employed it may be desirable to remove the hardened photoresist from the etched plate. Suitable solvents for removing the hardened photoresist are also described in H. Bennett, vol. VI, op. cit.

*Insulating Coating and Photoconductor Binders*

The following table comprises a list of commercial resins which have been found to be suitable for use as insulating coatings, binders for photoconductive particles, or as developer powders. In the last instance the resins are generally pigmented with toner material so that, when fused, a high contrast image is provided. In the table, suitable solvents for each resin are listed as well as solvents in which each resin is insoluble. Thus, from the table it is possible to select a coating (or binder) resin, a developer powder resin, and solvents having the required interdependence mentioned heretofore.

*Commercial Resins and Recommended Use*

| Resin | Use | Soluble in— | Insoluble in— |
|---|---|---|---|
| High Styrene Butadiene copolymer (Pliolite S-5). | C, T | K, E, $H_A$ | $Ac_s$, $Ac_w$, $Ak_w$, $Ak_s$, $A_L$, $H_L$. |
| Acrylic (Lucite, Acryloid). | C, T | K, E, $H_A$ | $Ac_w$, $Ac_s$, $Ak_w$, $Ak_s$, $H_L$, $A_L$. |
| Cellulose Acetate (Tenite Acetate). | C | $Ac_s$,[1] $Ak_s$,[1] $A_L$, K, E. | $Ac_w$, (fair) $Ak_w$, (fair) $H_A$, $H_L$. |
| Cellulose Acetate Butyrate (Tenite Butyrate). | C | $Ac_s$,[1] $Ak_s$,[1] $A_L$, K, E. | $Ac_w$, (fair) $Ak_w$, (fair) $H_A$, $H_L$. |
| Phenolic Varnish (Durez, Durite Resinox, Bakelite). | C | $Ac_s$,[2] $Ak_w$[3], $Ak_s$[3] | $Ac_w$, $A_L$, K, E, $H_A$, $H_L$. |
| Polystyrene (Styron, Lustrex). | C | K (swells) E, $H_A$ | $Ac_w$, $Ac_s$, $Ak_w$, $Ak_s$, $A_L$, $H_L$. |
| Polyethylene Low Density (Epolene C). | C, T | $H_A$, $H_L$ | $Ac_w$, $Ac_s$, $Ak_w$, $Ak_s$, $A_L$, K. E. |
| Polyvinyl Chloride Acetate (Vinylite VYNV). | C, T | $A_L$,[3] K, E, $H_A$,[3] $H_L$.[3] | $Ac_w$, $Ac_s$, $Ak_w$, $Ak_s$. |
| Silicone (GE, SR-82) | C | $Ak_s$, $H_A$, $H_L$, $A_L$ (softens). | $Ac_w$, $Ac_s$, (fair) $Ak_w$. |
| Styrene Polymers (Piccolastic C-125 D-100). | T | $H_A$, $H_L$, K, E | $Ac_s$. $Ac_w$, $Ak_s$, $Ak_w$, $A_L$. |

Key:
[1] Decomposes.
[2] Decomposed by oxidizing acids, reducing and organic acids no effect.
[3] Varying effects.
C=Coating.
T=Toner.
$Ac_w$=Weak acids.
$Ac_s$=Strong acids.
$Ak_w$=Weak alkalies.
$Ak_s$=Strong alkalies.
$A_L$=Alcohols.
K=Ketones.
E=Esters.
$H_A$=Aromatic hydrocarbons.
$H_L$=Aliphatic hydrocarbons.

*Printed Circuits*

The methods of this invention are also very well suited for the preparation of printed electrical circuits. In such preparation, a laminated structure is employed comprising an insulating base having thereon a conductive layer such as, for example, copper or silver. This laminated structure is substituted for the base plate 12 of sketch (*a*), and has a photoconductive insulating coating 11 on the copper layer on the side opposite to the base. The powder image of sketch (*d*) is preferably produced by electrophotographic techniques. The resist employed is preferably a photoresist and etching is continued until all of the conductive layer not covered by the photoresist is removed, leaving a pattern of conductive circuit elements on an insulating base.

SUMMARY

There have been described improved methods of preparing etched plates or printed circuits, which methods provide many advantages. For example, the use of photoconductive insulating coatings makes it possible to produce enlarged or reduced projected images without the necessity of preparing an intermediate transparency. The methods of this invention obviate many problems of limited shelf life. Also, the methods of this invention are readily adapted to existing equipment and require a minimum of skill and effort.

What is claimed is:

1. A method of utilizing a base plate comprising a metal layer capable of being engraved with an etchant, said layer having an insulating coating thereon, for producing an etched plate; said method comprising the steps of: electrostatically producing a powder image on said insulating coating; fusing the powder of said image to said coated layer; removing substantially all of the insulating coating not covered by said fused powder; applying resist material to said image bearing layer to provide a resist coating in areas on said layer not covered by said fused powder; and, removing said fused powder and etching said layer in areas thereon formerly covered by said fused powder.

2. A method of utilizing a base plate comprising a metal layer capable of being engraved with an etchant, said surface having an insulating coating thereon, for producing an etched plate; said method comprising the steps of: electrostatically producing a powder image including a visible toner on said insulating coating; fusing the powder of said image to said coated base plate; removing substantially all of the insulating coating not cover by said fused powder; applying resist material to said image bearing base plate to provide a resist coating in areas on said base plate not covered by said fused powder; and, removing said fused powder and etching said base plate in areas thereon formerly covered by said fused powder.

3. A method of producing a printing plate utilizing a metal plate capable of being engraved with an etchant, said surface having an insulating coating thereon comprising a resinous material soluble in a first solvent; said method comprising the steps of: electrostatically producing a powder image on said coating, the powder of said image being insoluble in said first solvent but soluble in a second solvent which is also a solvent for said coating but is different from said first solvent; fusing said powder to said coated base plate; applying said first solvent to said image bearing base plate to remove all portions of said coating not covered by said fused powder; applying a coating composition to said image bearing base plate to produce thereon, in areas not covered by said fused powder, a coating comprising a resist for said etchant and for said second solvent, said fused powder being substantially insoluble in said composition; applying said second solvent to said image bearing base plate to remove therefrom said fused powder and the remainder of said insulating coating; and applying said etchant to said metal plate to engrave said plate in areas formerly covered by said fused powder.

4. The method of claim 1 wherein said resist coating is produced by plating a metal onto said base plate.

5. The method of claim 1 wherein said resist coating is produced by applying to said base plate a photochemical resist material which is then hardened before applying said second solvent to said image bearing base plate.

6. A method of producing a printed circuit from a metal clad base plate capable of being engraved with an etchant; said plate having on one surface thereof a photoconducting insulating coating comprising a finely-divided photoconductor dispersed in a resinous binder which is soluble in a first solvent; said method comprising electrophotographically producing a powder image on said coating with a resin which is insoluble in said first solvent but which is soluble in a common solvent for said resinous binder; fusing the powder of said image to said coating; applying said first solvent to said image bearing coating to remove coating material not covered by said fused powder; applying a coating composition to said image bearing base plate to produce in all areas thereon not covered by said fused powder a resist for said etchant and for said common solvent; applying said common solvent to said fused powder to remove said fused powder and remaining photoconductive coating; and removing said metal with an etchant from all areas on said base plate not covered by said resist.

7. The method of claim 6 wherein said resist is produced by coating onto said base plate a photochemical resist material which is then hardened before applying said common solvent to said fused powder.

8. A method of producing a printing plate comprising the steps of: (1) providing a metal base plate capable of being engraved with an etchant, said plate having on one surface thereof a photoconducting insulating coating comprising a finely-divided photoconductor dispersed in a resinous binder which is soluble in a first solvent; (2)

electrophotographically producing a powder image on said coating with a pigmented resin which is insoluble in said first solvent but which is soluble in a common solvent for said resinous binder; (3) fusing the powder of said image to said coating; (4) removing said coating from areas not covered by said fused powder with said first solvent; (5) cleaning said image bearing base plate with a dilute etchant solution; (6) applying a fountain solution to said image bearing base plate; (7) inking said fused powder; (8) applying a photoresist composition to said image bearing base plate to produce in all areas thereon not covered by said fused powder a resist for said etchant and said common solvent; (9) hardening said resist; (10) removing said fused powder and remaining coating with said common solvent; (11) etching said base plate; and (12) removing said hardened photoresist with a solvent therefor.

References Cited in the file of this patent

UNITED STATES PATENTS

| | | |
|---|---|---|
| 444,952 | Goodwin | Jan. 20, 1891 |
| 2,602,731 | Nierenberg | July 8, 1952 |
| 2,699,425 | Nieter | Jan. 11, 1955 |
| 2,733,171 | Ransburg | Jan. 31, 1956 |
| 2,857,271 | Sugarman | Oct. 21, 1958 |
| 2,881,073 | Maclay | Apr. 1, 1959 |
| 2,939,787 | Giaimo | June 7, 1960 |